US010283318B1

(12) United States Patent
Kusterer et al.

(10) Patent No.: US 10,283,318 B1
(45) Date of Patent: May 7, 2019

(54) EXTRACTION ELECTRODE ARMS

(71) Applicant: TEXAS INSTRUMENTS INCORPORATED, Dallas, TX (US)

(72) Inventors: Juergen Peter Kusterer, Freising (DE); Wolfgang Springl, Unterschleissheim (DE); Thomas Thanner, Buch am Erlbach (DE); Karl Zotter, Pliening (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/849,437

(22) Filed: Dec. 20, 2017

(51) Int. Cl.
*H01J 37/317* (2006.01)
*H01J 37/08* (2006.01)

(52) U.S. Cl.
CPC .......... *H01J 37/3171* (2013.01); *H01J 37/08* (2013.01); *H01J 2237/08* (2013.01)

(58) Field of Classification Search
CPC ..... H01J 37/3171; H01J 37/08; H01J 2237/08
USPC .............. 250/396 R, 397, 492.1, 492.3
See application file for complete search history.

(56) References Cited

U.S. PATENT DOCUMENTS

| 2013/0105705 A1* | 5/2013 | Inouchi | H01J 27/024 250/423 R |
| 2016/0111250 A1* | 4/2016 | Sato | H01J 37/08 313/153 |
| 2016/0143123 A1* | 5/2016 | Groves | H05H 3/00 376/247 |

OTHER PUBLICATIONS

Axcelis Technologies, Inc., Axcelis Electrode Arm Upper Drawing, 1 p.

* cited by examiner

*Primary Examiner* — Nicole M Ippolito
(74) *Attorney, Agent, or Firm* — Rose Alyssa Keagy; Charles A. Brill; Frank D. Cimino

(57) ABSTRACT

An extraction electrode arm includes first and second ends spaced apart along a longitudinal axis and first and second sides spaced apart along a lateral axis. The arm also includes first and second surfaces apart, extending longitudinally between the first and second ends and laterally between the first and second sides. The arm further includes a base portion extending from the first end toward the second end and extending between the first and second sides, an end portion longitudinally spaced apart from the base portion and extending to the second end, and a diagonal shank portion extending between the base portion and the end portion and extending laterally from a first diagonal surface region on the first side to a second diagonal surface region on the second side. The diagonal shank portion has a shank thickness that extends laterally between the first and second diagonal surface regions.

20 Claims, 5 Drawing Sheets

EXTRACTION ELECTRODE ARMS

BRIEF SUMMARY OF THE DISCLOSURE

The present disclosure presents extraction electrode arms for ion implanters. In an example, an extraction electrode arm includes a first end spaced apart from a second end along a longitudinal axis, a first side spaced apart from a second side along a lateral axis substantially perpendicular to the longitudinal axis, and a first surface apart from a second surface. The first and second sides extend longitudinally between the first and second ends. The first and second surfaces extend longitudinally between the first and second ends and extend laterally between the first and second sides. The extraction electrode arm also includes a base portion, a first shank portion, a second shank portion, a third shank portion, a fourth shank portion, a fifth shank portion, and an end portion. The base portion extends longitudinally from the first end toward the second end and extends laterally between the first and second sides. The first shank portion has a first shank thickness extending longitudinally from the first base portion toward the second end, and extending laterally from the first side. The second shank portion has a second shank thickness extending longitudinally from the first shank portion toward the second end. The third shank portion has a third shank thickness, extending longitudinally from the second shank portion toward the second end. The fourth shank portion tapering longitudinally along the second surface from the third shank thickness at the third shank portion to a fourth shank thickness. The fifth shank portion has a fourth shank thickness extending longitudinally from the fourth shank portion toward the second end, and extending laterally from the first side to the second side. The end portion extends longitudinally from the fifth shank portion to the second end and extends laterally from the first side to the second side. The third shank portion also includes a third diagonal surface region on the first side.

In another example, an ion implanter includes an ion source, a rotatable process disk disposed in a path of an ion beam from the ion source, and an extraction electrode assembly disposed between the ion source and the rotatable process disk, the extraction electrode assembly including an extraction electrode arm. In this example, the extraction electrode arm includes a first end spaced apart from a second end along a longitudinal axis, a first side spaced apart from a second side along a lateral axis not parallel to the longitudinal axis, and a first surface apart from a second surface. The first and second sides extending longitudinally between the first and second ends. The first and second surfaces extend longitudinally between the first and second ends and extend laterally between the first and second sides. In addition, the ion implanter includes a base portion, a first shank portion, a second shank portion, a third shank portion, and an end portion. The base portion extends longitudinally from the first end toward the second end and extends laterally between the first and second sides. The first shank portion has a first shank thickness extending longitudinally from the first base portion toward the second end and extending laterally from the first side. The second shank portion has a second shank thickness extending longitudinally from the first shank portion toward the second end and extending laterally from a first diagonal surface region on the first side to a second diagonal surface region on the second side. The third shank portion has a third shank thickness extending longitudinally from the second shank portion toward the second end. The end portion has an end portion thickness extending longitudinally from the second end toward the third shank portion and extending laterally from the first side to the second side. In addition, the third shank thickness extends laterally from the first side to the second side along a longitudinal length of the third shank portion.

In still another example, an extraction electrode arm includes a first end spaced apart from a second end along a longitudinal axis and a first side spaced apart from a second side along a lateral axis not parallel to the longitudinal axis. The first and second sides extend longitudinally between the first and second ends. In addition, the extraction electrode arm includes a first surface apart from a second surface such that the first and second surfaces extend longitudinally between the first and second ends and extending laterally between the first and second sides. In this example, the arm also includes a base portion extending longitudinally from the first end toward the second end and extending laterally between the first and second sides, an end portion longitudinally spaced apart from the base portion and extending to the second end, and a diagonal shank portion extending longitudinally between the base portion and the end portion and extending laterally from a first diagonal surface region on the first side to a second diagonal surface region on the second side and having a shank thickness. The shank thickness of the diagonal shank portion extends laterally from the first diagonal surface region to the second diagonal surface region.

BRIEF DESCRIPTION OF THE DRAWINGS

For a detailed description of the disclosed examples, reference will now be made to the accompanying drawings in which.

NOTATION AND NOMENCLATURE

Figure 1:
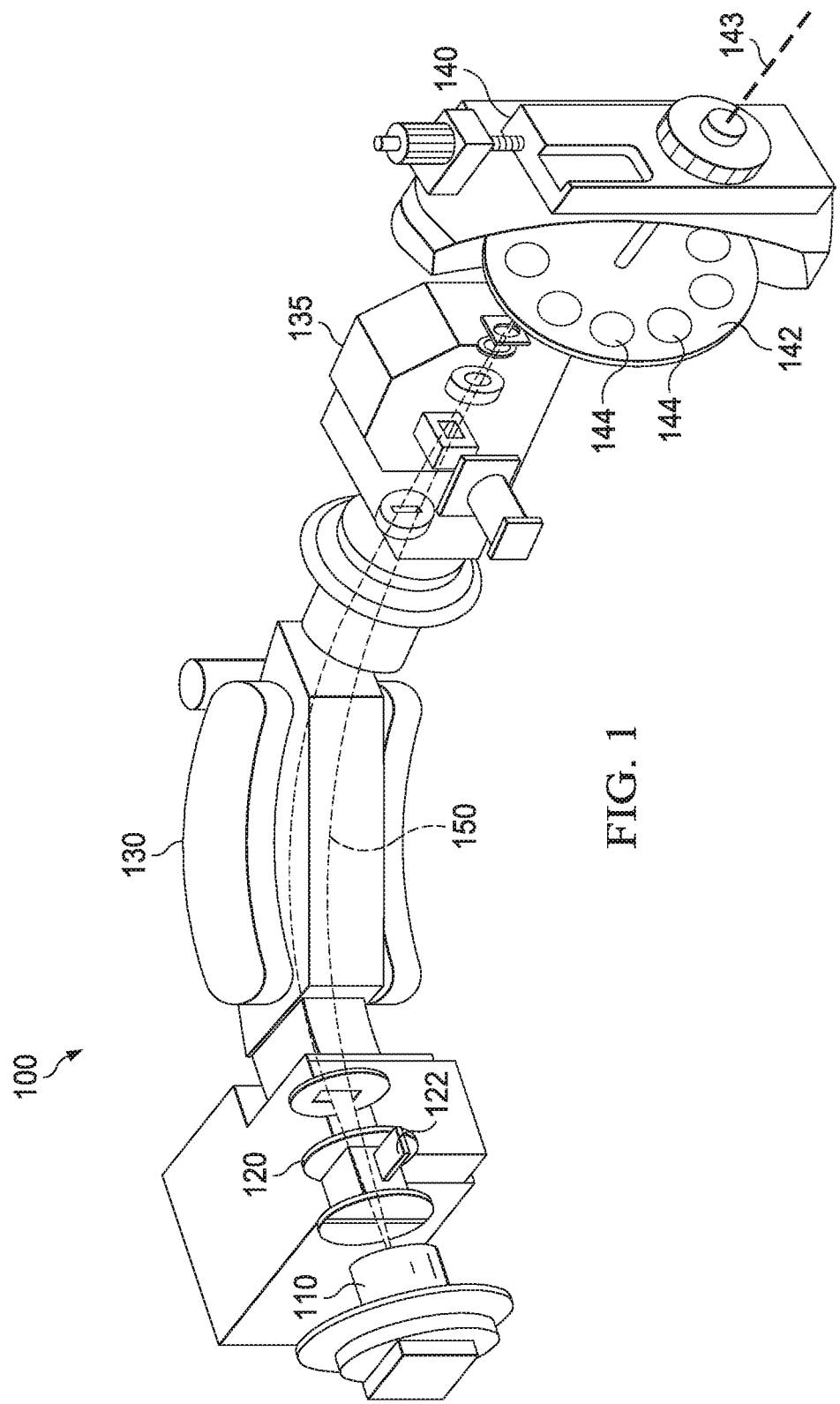
FIG. 1 shows a perspective view in schematic form of an example of an ion implanter in accordance with principles described herein.

The following description is exemplary of certain examples of the disclosure. It is to be understood that the following description has broad application, and the discussion of any example is meant to be exemplary of that example, and is not intended to suggest in any way that the scope of the disclosure, including the claims, is limited to that example.

The figures are not drawn necessarily to-scale. Certain features and components disclosed herein may be shown exaggerated in scale or in somewhat schematic form, and some details of conventional elements may not be shown in the interest of clarity and conciseness. In some of the figures, in order to improve clarity and conciseness, one or more components or aspects of a component may be omitted or may not have reference numerals identifying the features or components. In addition, within the specification, including the drawings, like or identical reference numerals may be used to identify common or similar elements.

As used herein, including in the claims, the terms "including" and "comprising," as well as derivations of these, are used in an open-ended fashion, and thus are to be interpreted to mean "including, but not limited to . . . ." Also, the term "couple" or "couples" means either an indirect or direct connection. Thus, if a first component couples or is coupled to a second component, the connection between the components may be through a direct engagement of the two components, or through an indirect connection that is accomplished via other intermediate components, devices and/or connections. The recitation "based on" means "based at least in part on." Therefore, if X is based on Y, then X may be based on Y and on any number of other factors. The word "or" is used in an inclusive manner. For example, "A or B" means any of the following: "A" alone, "B" alone, or both "A" and "B." In addition, the word "substantially" means within a range of plus or minus 10% of the stated value, if any. If the term "substantially" is used to refer to a particular configuration—for example, "substantially parallel" or "substantially perpendicular"—the term means that the two objects in question are within plus or minus 15 degrees of the stated configuration. For example, a first plane is substantially parallel to a second plane if the first plane is within 15 degrees of parallelism to the second plane.

Any reference to a relative direction or relative position is made for purpose of clarity, with examples including "top," "bottom," "up," "upper," "upward," "down," "lower," "clockwise," "left," "leftward," "right," and "right-hand." For example, a relative direction or a relative position of an object or feature may pertain to the orientation as shown in a figure or as described. If the object or feature were viewed from another orientation or were implemented in another orientation, it may then be helpful to describe the direction or position using an alternate term.

DETAILED DESCRIPTION OF EXAMPLE EMBODIMENTS

Referring to the schematic-type view of FIG. 1, in an example, ion implanter 100 includes an ion source 110, an extraction electrode assembly 120 with an extraction electrode arm 122, an analyzing magnet 130, a focusing apparatus 135, and a target device 140 with a rotatable process disk 142. Disk 142 is configured to rotate about an axis 143 while holding a plurality of silicon wafers 144 circumferentially spaced at a prescribed distance from axis 143. The plurality of silicon wafers 144 on disk 142 may also be called a batch of wafers. During operation, an ion beam path 150 is output from ion source 110 and extends to disk 142 of target device 140, passing through or adjacent extraction electrode assembly 120, analyzing magnet 130, and the focusing apparatus 135. During operation, ion source 110 is activated and an ion beam travels along path 150, impinging on each of the wafers 144 in sequence as process disk 142 rotates.

In some examples ion implanter 100 is a gyro super disk (GSD)-type ion implanter. In some examples target device 140 is configured to rotate the process disk 142 at a speed of approximately 1210 revolutions per minute (RPM) while an ion beam impinges on wafers 144.

Figure 2:
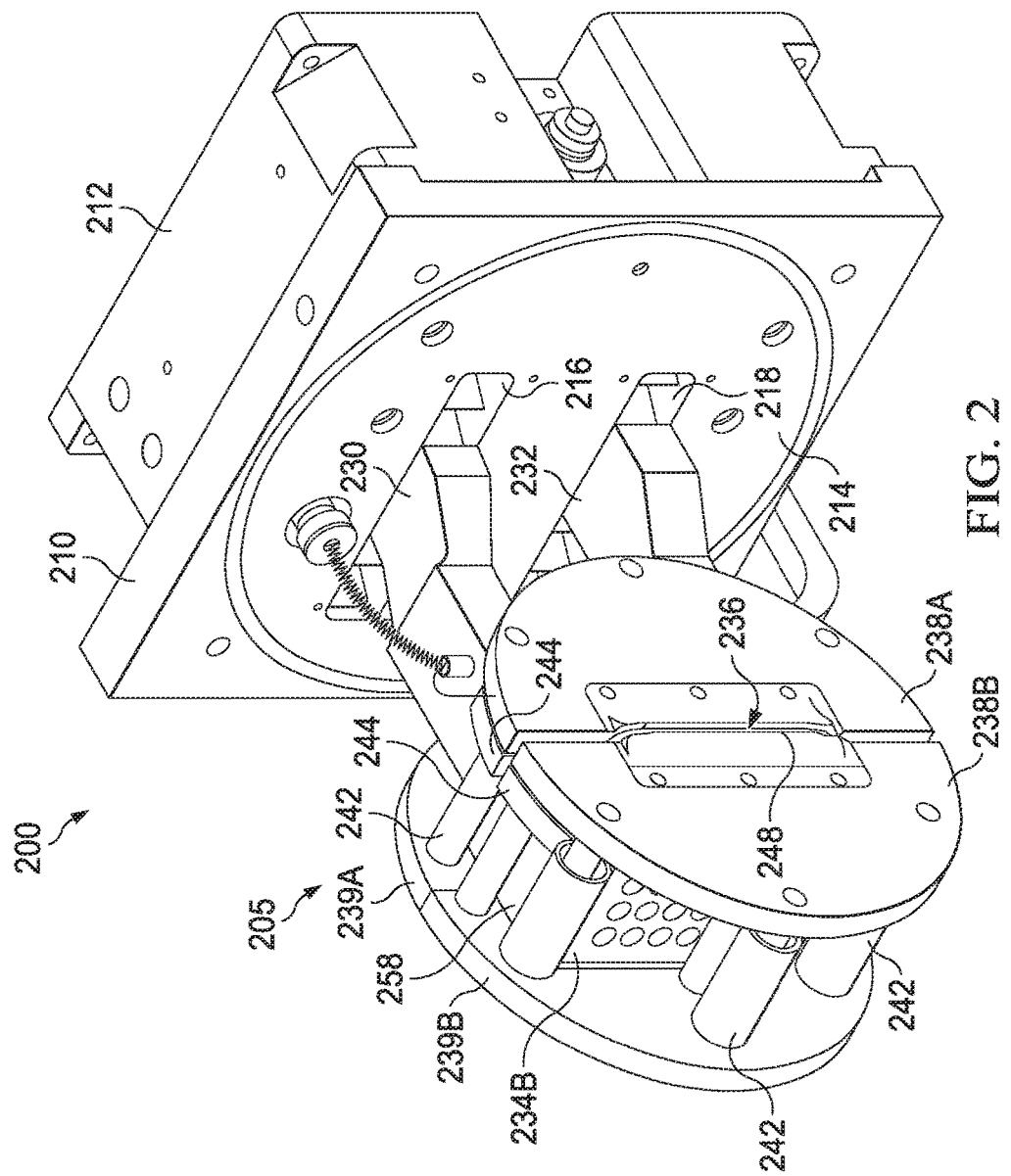
FIGS. 2 and 3 show perspective views of an example extraction electrode assembly in accordance with principles described herein.
Figure 3:
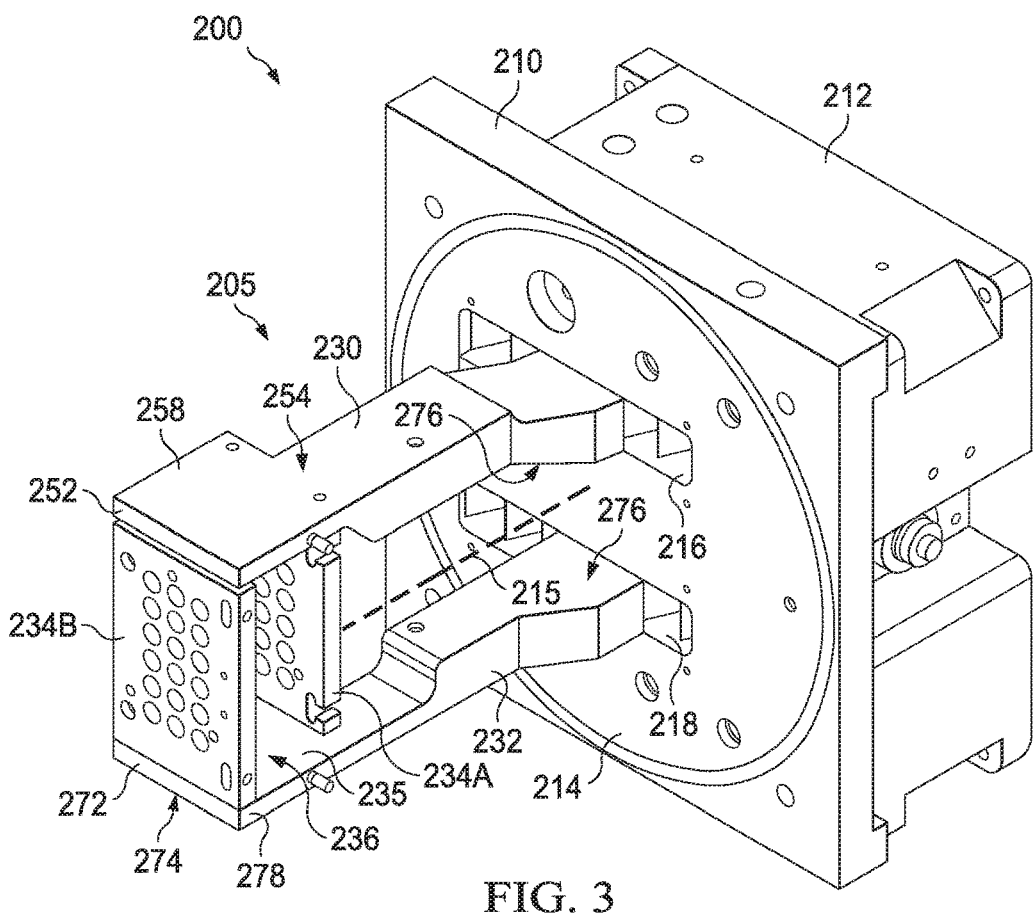

FIG. 2 and FIG. 3 depict an example extraction electrode assembly 200 that may be installed or used as the extraction electrode assembly 120 in ion implanter 100 of FIG. 1. Extraction electrode assembly 200 includes an extraction electrode 205 extending from a base 210. Base 210 includes a body 212 having a front face 214 with a body axis 215 extending through face 214. In FIG. 3, axis 215 is substantially perpendicular to at least a portion of face 214. A first slot 216 and a second slot 218 extend through face 214, spaced apart from each other with axis 215 disposed between slots 216, 218. Extraction electrode 205 extends through slots 216, 218 along or substantially parallel to axis 215, extending beyond face 214. In the example of FIGS. 2 and 3, slots 216, 218 are horizontal and first slot 216 is located above second slot 218.

In this example, extraction electrode 205 is an assembly that includes a first extraction electrode arm 230 extending through slot 216 substantially parallel to axis 215, a second extraction electrode arm 232 extending through slot 218 substantially parallel to arm 230, and a pair of variable electrode shields 234A, 234B held between arms 230, 232 substantially parallel to face 214 at a location distal face 214. Referring to FIG. 3, shields 234A, 234B are spaced apart from one another with shields 234B disposed farther from face 214 than shields 234A. The assemblage and the spacing of electrode arms 230, 232 and shields 234A, 234B configure a rectangular chamber 235 that includes a portion of an ion beam path 236. Referring again to FIG. 2 and FIG. 3, extraction electrode 205 also includes a first pair of suppression plates 238A, 238B disposed and covering an open face of chamber 235 and a field ring, configured as plates 239A, 239B disposed adjacent and covering an opposite face of chamber 235, spaced apart from suppression plates 238A, 238B. A plurality of insulating spacers 242 extend between and couple the plates 238A, 238B to the opposite plates 239A, 239B. A plurality of electrode grounds 244, configured as plates, are disposed between suppression plates 238A, 238B and the assemblage of electrode arms 230, 232 and shields 234A, 234B.

Suppression plate 238A is spaced apart from plate 238B, forming a narrow slot or extraction aperture 248 therebetween. The width of aperture 248 from plate 238A to plate 238B is narrow as compared to the length of aperture 248, which extends substantially parallel to shield variable shields 234A, 234B and substantially perpendicular to arms 230, 232. A second, similar slot or extraction aperture (not visible) is disposed between the other pair of suppression plates, plates 239A, 239B. Ion beam path 236 extends through aperture 248, chamber 235, and the second aperture between plates 239A, 239B. When assembled in a system such as ion implanter 100, path 236 corresponds to ion beam path 150.

In the examples of FIG. 2 and FIG. 3, front face 214 of extraction electrode assembly body 212 is oriented vertically, electrode arms 230, 232 are oriented horizontally with arm 230 above arm 232, and extraction aperture 248 is oriented vertically; other orientations are feasible for assembly 200 or for one or more of its components. Based on the orientation of this example, first extraction electrode arm 230 may also be called upper extraction electrode arm 230, and second extraction electrode arm 232 may also be called lower extraction electrode arm 232. In other examples, arms 230, 232 or other components may be arranged in a different orientation.

Continuing to reference FIG. 3, first extraction electrode arm 230 extends from a first end (not visible) disposed within 216 and body 212 of assembly 200 to a second end 252 disposed the front face 214. Arm 230 includes a first surface 254 and a second surface 256, both extending between the first end and the second end 252. An end portion 258 of arm 230 is disposed at second end 252. Similarly, second extraction electrode arm 232 extends from a first end (not visible) disposed within slot 218 and body 212 of assembly 200 to a second end 272 disposed distal the front face 214. Arm 232 includes a first surface 274 and a second surface 276, both extending between the first end and the second end 272. An end portion 278 of arm 230 is disposed at second end 262. With respect to the extraction electrode 205 as a unit, first surfaces 254, 274 of arms 230, 232 face outward, and second surfaces 256, 276 face inward, toward each other. Shield variable shields 234A, 234B are held between end portions 258, 278 of arms 230, 232 along the inward, second surfaces 256, 276. End portions 258, 278 of the arms form some of the boundary of chamber 235.

Figure 4:
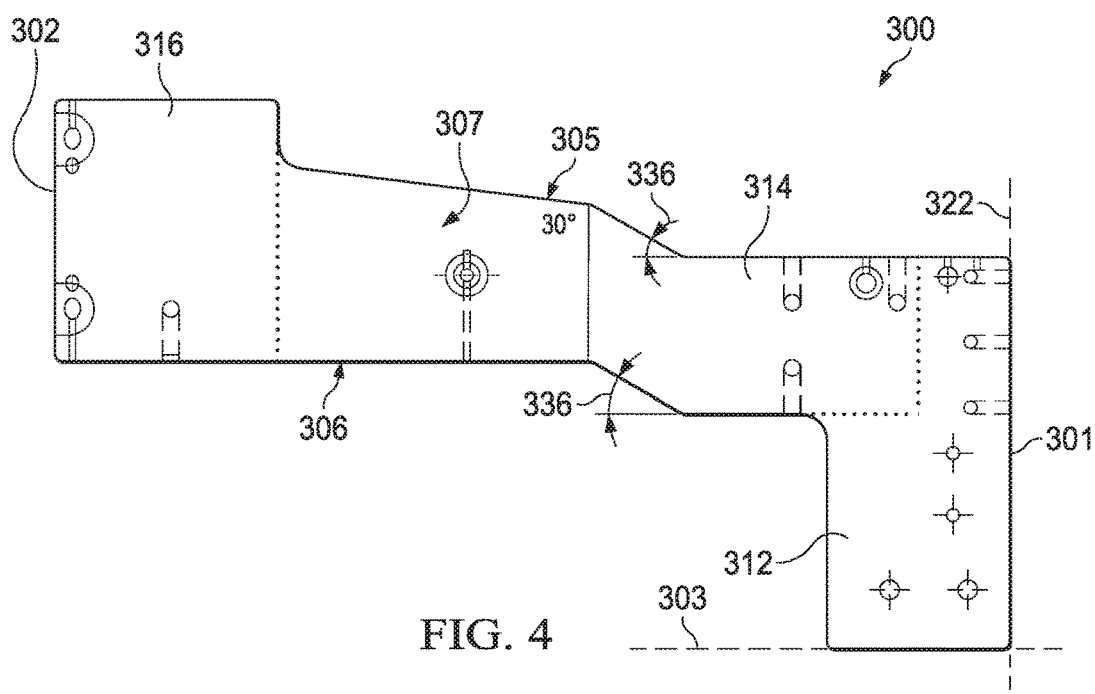
FIG. 4 shows a plan of an example extraction electrode arm in accordance with principles described herein.
Figure 5:
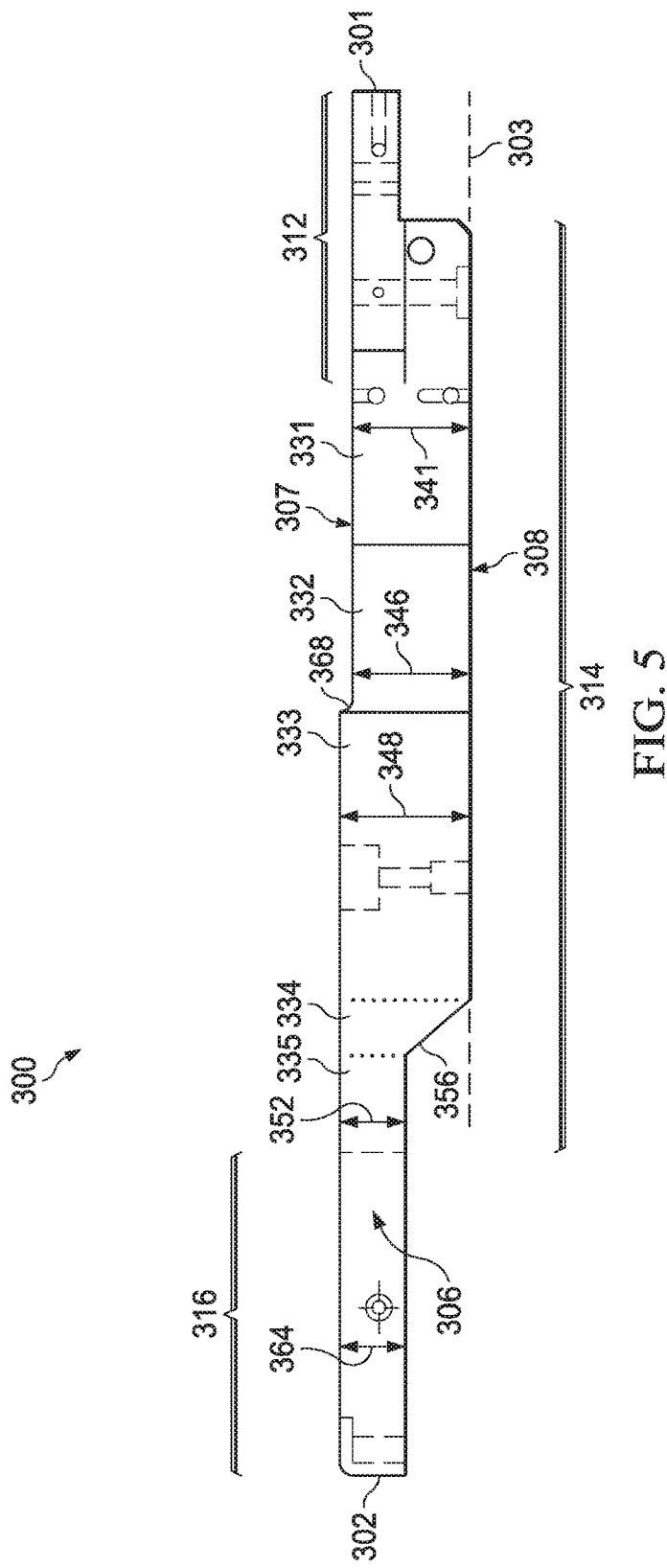
FIG. 5 shows a side view of the example extraction electrode arm of FIG. 4 in accordance with principles described herein.
Figure 6:
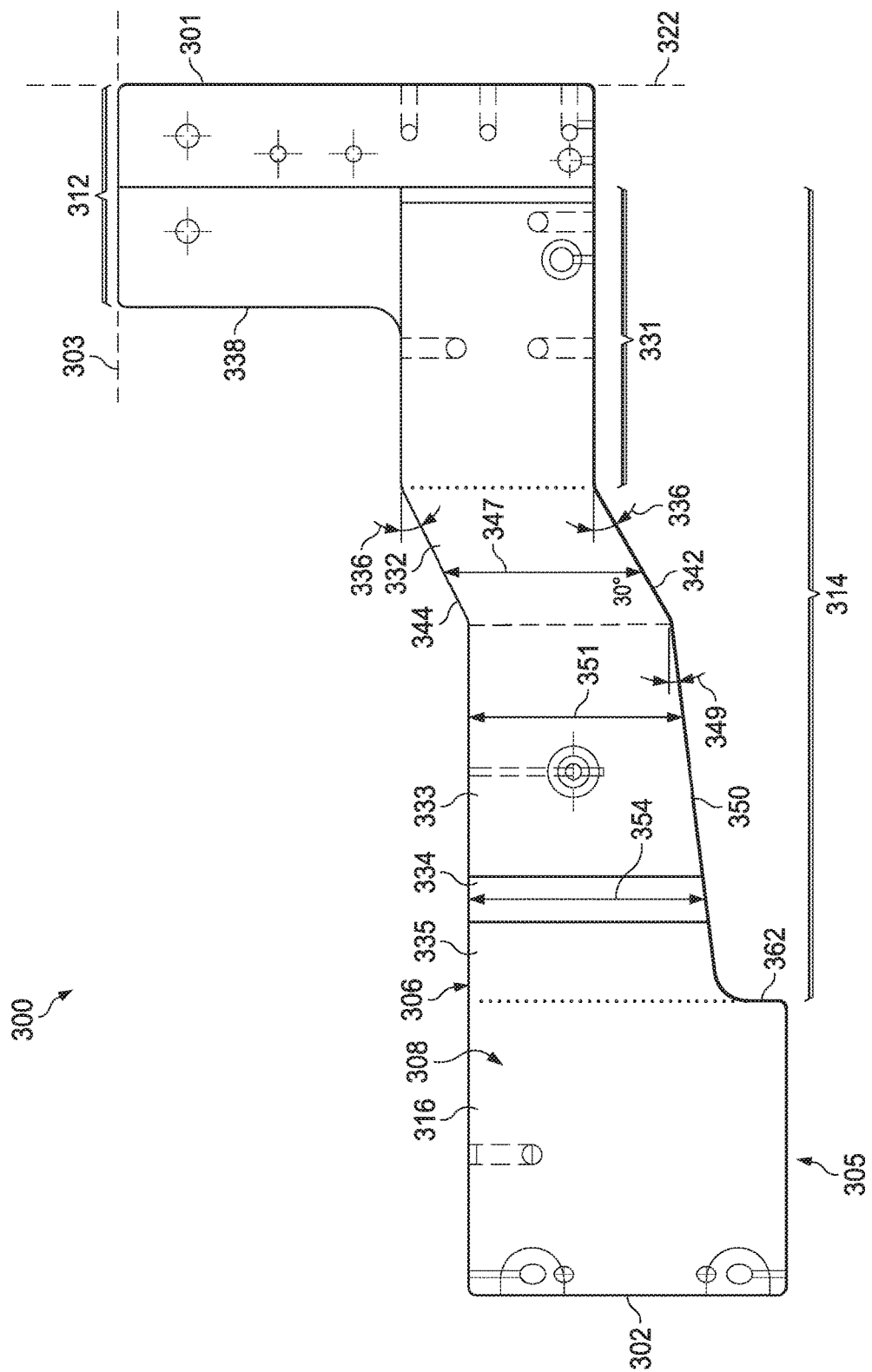
FIG. 6 shows a bottom view of the example extraction electrode arm of Figure in accordance with principles described herein.

FIGS. 4-6 present an example extraction electrode arm 300 that may be installed or used as the first or upper extraction electrode arm 230 of extraction electrode assembly 200 in FIG. 2 or in another extraction electrode assembly for an ion implanter. In some examples, extraction electrode arm 300 may be installed or used as a second or lower extraction electrode arm. Referring now to FIG. 4 and FIG. 5, extraction electrode arm 300 includes a first end 301 spaced apart from a second end 302 along a longitudinal axis 303, a first side 305 and a second side 306 extending longitudinally between ends 301, 302, an outer first surface 307 and an outer second surface 308 extending longitudinally between ends 301, 302 and laterally between sides 305, 306, a base portion 312 extending longitudinally from first end 301 toward second end 302, a shank portion or, simply, shank 314 extending from base portion 312 toward second end 302 (as indicated by dotted lines in FIG. 4), and an end portion 316 extending from shank 314 to second end 302. The first side 305 is spaced apart from a second side 306 along a lateral axis 322 substantially perpendicular (or, more generally, not parallel) to the longitudinal axis 303. The first and second surfaces 307, 308 are spaced apart from one another and face in opposite directions, away from each other. Base portion 312 extends laterally between the first and second side 305, 306 and includes an L-shape when viewed from surface 307, 308.

Referring to FIG. 5 and FIG. 6, shank 314 includes a first shank portion 331 extending longitudinally from the first base portion 312 toward the second end 302, a second shank portion 332 extending longitudinally from the first shank portion 331, a third shank portion 333 extending longitudinally from the second shank portion 332, a fourth shank portion 334 extending longitudinally from the third shank portion 333, and a fifth shank portion 335 extending longitudinally from the fourth shank portion 334. End portion 316 extends from the fifth shank portion 335 to the second end 302. Note: in some instances in the Figures, dotted lines are added to clarify the general location of a boundary between two neighboring portions of arm 300.

First shank portion 331 extends laterally from the first side 305 toward second side 306, intersecting base portion 312. Base portion 312 is wider in the lateral direction (substantially parallel to axis 322) than is first shank portion 331, such that second side 306 includes a lateral shoulder 338 along base portion 312, adjacent first shank portion 331. First shank portion 331 includes a first shank thickness 341. Second shank portion 332 extends laterally from a first diagonal surface region 342 on the first side 305 to a second diagonal surface region 444 on the second side 306. Based on the geometry, second shank portion 332 may also be called a diagonal shank portion. First shank portion 331, being between portions 312, 332 may also be called an intermediate shank portion. Diagonal surface regions 342, 344 both extend an acute angle 336 greater than zero with respect to longitudinal axis 303. In some other examples, surface regions 342, 344 may extend away from axis 303 at two different angles.

Second shank portion 332 has a second shank thickness 346 that extends laterally across the width 347 of the second shank portion 332, extending fully from diagonal surface region 342 to diagonal surface region 344 and extends longitudinally along the length of the second shank portion 332. In this example, first shank thickness 341 and the second shank thickness 346 are equal and are greater than a thickness of base portion 312.

On the first side 305, a third diagonal surface region 350 extends along the third shank portion 333, the fourth shank portion 334, and the fifth shank portion 335, intersecting end portion 316 at a smooth angle. Third diagonal surface region 350 extends an acute angle 349 with respect to longitudinal axis 303. In this example, angle 349 is greater than zero and less than angle 336. In this example, angle 349 is less than one half of angle 336.

Third shank portion 333 has a third shank thickness 348 that extends laterally across the full width 351 of the third shank portion 333 from the third diagonal surface region 350 on the first side 305 to the second side 306 and extends longitudinally along the length of the third shank portion 333.

Continuing to reference FIG. 5 and FIG. 6, Fourth shank portion 334 tapers longitudinally along the second surface 308 from the third shank thickness 348 at the third shank portion 333 to a lesser, fourth shank thickness 352. The width 354 of the taper 356 of the fourth shank portion 334 extends across the full the lateral span of the fourth shank portion 334 from the first side 305 to the second side 306. In FIGS. 4 and 5, the tapering in the fourth shank portion 334 occurs along a continuous, flat portion of the second surface 308. Width 351 and width 354 vary along longitudinal axis 303 based on the third diagonal surface region 350 of side 305.

Fifth shank portion 335 extends laterally from the first side 305 to the second side 306 and is characterized uniformly by the fourth shank thickness 352, which is less than the third shank thickness 348. In various examples, third shank thickness 348 is greater than or equal to second shank thickness 346 or is greater than or equal first shank thickness 341.

End portion 316 has an end portion thickness 364 that extend laterally from the first side 305 to the second side 306. A lateral width of end portion 316 is greater than a lateral width of the fifth shank portion 335, providing a lateral shoulder 362 extending from fifth shank portion 335 along first side 306. The thickness 364 of end portion 316 is less than the second shank thickness 346 that extends across the full width 347 of second shank portion 332 and is less than third shank thickness 348 that extends across the full width 351 of third shank portion 333. In the example of FIG. 5, end portion thickness 364 is equal to the fourth shank thickness 352 of fifth shank portion 335.

As described above, first side 305 extends along portions 312, 314, 316 and includes the first diagonal surface, the third diagonal surface region 350, and lateral shoulder 362. Second side 306 extends along portions 312, 314, 316 and includes the second diagonal surface region 344 and lateral shoulder 338.

As shown in FIG. 5, first surface 307 comprises a depression or recess 368 extending laterally along a junction between the second and third shank portions 332, 333 and extending longitudinally to the first end 301. Recess 368 extends longitudinally to first end 301. The second shank thickness 346 differs from the third shank thickness 348 by a depth of the recess 368. In some examples, recess 368 facilitates the assembly of extraction electrode arm 300 into an extraction electrode assembly. Such occurs when arm 300 is installed as a first extraction electrode arm 230 for extraction electrode assembly 200 of FIG. 2 or when such an extraction electrode is installed in an ion implanter.

In the examples of FIGS. 4-6, the thicknesses 341, 346, 348, 352, 364 are shown as being uniform throughout the entirety or the majority of the respective portions where the thicknesses are defined, not including fourth portion 334, which has a tapered thickness. In some examples of arm 300, a portion or multiple portions 312, 331, 332, 333, 334, 335, 316 includes variations in thickness in addition to what is shown in the figures or verbally described herein. In some examples of arm 300, a portion or multiple portions 312, 331, 332, 333, 334, 335, 316 includes less variation in thickness than is shown in the figures or verbally described herein.

Extraction electrode arms 122, 230, 300, as disclosed herein are configured to provide acceptable and reliable stability in the position of an extraction aperture, such as extraction aperture 248 of extraction electrode assembly 200 (FIG. 2-3) when installed in ion implanter 100 (FIG. 1). Extraction electrode arms 122, 230, 300 are configured to result in a different natural resonance frequency of the extraction electrode assembly 120 than a conventional extraction electrode arm assembly. In an example, extraction electrode arms 122, 230, 300 is configured to provide stability for an extraction aperture when installed as the first or upper electrode arm in an Axcelis®, model NV-GSD 200E$^2$, ion implanter operating rotatable process disk 142 at a speed of approximately 1210 RPM. Other operational speeds of process disk 142 are contemplated for this and various other ion implanters. The extraction electrode arms 122, 230, 300 disclosed herein are configured to reduce or eliminate sinusoidal variations in ion dopings produced by some GSD ion implanters; wherein, in some examples, those sinusoidal variations are related to a rotational speed of process disk 142.

Although extraction electrode arm 300 was described herein as being configured for installation in one of the two slots 216, 218 of an extraction electrode assembly 200 (FIGS. 2 and 3), in some examples, a pair of similar or identical extraction electrode arms 300 are installed in both slots 216, 218 of an extraction electrode assembly. In some embodiments, an extraction electrode arm 122, 230, 232, 300 comprises graphite, and in some of these embodiments, the extraction electrode arm is entirely graphite.

While exemplary examples have been shown and described, modifications thereof can be made without departing from the scope or teachings herein. The examples described herein are exemplary only and are not limiting. Many variations, combinations, and modifications of the systems, apparatuses, and processes described herein are possible and are within the scope of the disclosure. Accordingly, the scope of protection is not limited to the examples described herein, but is only limited by the claims that follow, the scope of which shall include all equivalents of the subject matter of the claims.

What is claimed is:

1. An extraction electrode arm comprising:
    a first end spaced apart from a second end along a longitudinal axis;
    a first side spaced apart from a second side along a lateral axis substantially perpendicular to the longitudinal axis, the first and second sides extending longitudinally between the first and second ends;
    a first surface apart from a second surface, the first and second surfaces extending longitudinally between the first and second ends and extending laterally between the first and second sides;
    a base portion extending longitudinally from the first end toward the second end and extending laterally between the first and second sides;
    a first shank portion having a first shank thickness extending longitudinally from the first base portion toward the second end, and extending laterally from the first side;
    a second shank portion having a second shank thickness extending longitudinally from the first shank portion toward the second end;
    a third shank portion having a third shank thickness, extending longitudinally from the second shank portion toward the second end;
    a fourth shank portion tapering longitudinally along the second surface from the third shank thickness at the third shank portion to a fourth shank thickness;
    a fifth shank portion having the fourth shank thickness extending longitudinally from the fourth shank portion toward the second end, and extending laterally from the first side to the second side; and
    an end portion extends longitudinally from the fifth shank portion to the second end and extends laterally from the first side to the second side,
    wherein the third shank portion includes a third diagonal surface region on the first side.
2. The extraction electrode arm of claim 1 wherein the third shank thickness extends laterally from the third diagonal surface region on the first side to the second side along a longitudinal length of the third shank portion.
3. The extraction electrode arm of claim 1 wherein the second shank thickness of the second shank portion extends laterally from a first diagonal surface region on the first side to a second diagonal surface region on the second side.
4. The extraction electrode arm of claim 1 wherein the tapering of the fourth shank portion from the third shank thickness to a fourth shank thickness extends from the first side to the second side.
5. The extraction electrode arm of claim 1, wherein the first side includes a third diagonal surface region, extending from the third shank portion into the fifth shank portion.
6. The extraction electrode arm of claim 1 wherein first shank thickness and the second shank thickness are equal.
7. The extraction electrode arm of claim 1 wherein the first surface comprises a recess extending laterally along a junction between the second and third shank portions and extending longitudinally to the first end; and
    wherein the second shank thickness differs from the third shank thickness by a depth of the recess.
8. The extraction electrode arm of claim 1 wherein the tapering from the third shank thickness to the fourth shank thickness in the fourth shank portion occurs along a continuous, flat portion of the first surface; and
    wherein the fifth shank portion has a uniform thickness.
9. The extraction electrode arm of claim 1 wherein the second shank thickness of the second shank portion is greater than the end portion thickness.
10. An ion implanter comprising:
    an ion source;
    a rotatable process disk disposed in a path of an ion beam from the ion source; and an extraction electrode assembly disposed between the ion source and the rotatable process disk, the extraction electrode assembly including an extraction electrode arm comprising:
- a first end spaced apart from a second end along a longitudinal axis;
- a first side spaced apart from a second side along a lateral axis not parallel to the longitudinal axis, the first and second sides extending longitudinally between the first and second ends;
- a first surface apart from a second surface, the first and second surfaces extending longitudinally between the first and second ends and extending laterally between the first and second sides;
- a base portion extending longitudinally from the first end toward the second end and extending laterally between the first and second sides;
- a first shank portion having a first shank thickness extending longitudinally from the first base portion toward the second end, and extending laterally from the first side;
- a second shank portion having a second shank thickness extending longitudinally from the first shank portion toward the second end, and extending laterally from a first diagonal surface region on the first side to a second diagonal surface region on the second side;
- a third shank portion having a third shank thickness extending longitudinally from the second shank portion toward the second end; and
- an end portion having an end portion thickness extending longitudinally from the second end toward the third shank portion and extending laterally from the first side to the second side,
- wherein the third shank thickness extends laterally from the first side to the second side along a longitudinal length of the third shank portion.

11. The ion implanter of claim 10 wherein the second shank thickness of the extraction electrode arm extends laterally from the first diagonal surface region on the first side to the second diagonal surface region on the second side along a longitudinal length of the second shank portion.

12. The ion implanter of claim 10 wherein the third shank portion of the extraction electrode arm includes a third diagonal surface region on the first side; and
wherein the third shank thickness extends laterally from the third diagonal surface region to the second side.

13. The ion implanter of claim 10 wherein the extraction electrode arm further includes:
- a fourth shank portion tapering along the second surface from the third shank thickness at the third shank portion to a fourth shank thickness while extending toward the second end; and
- a fifth shank portion having the fourth shank thickness, extending longitudinally from the fourth shank portion toward the second end, and extending laterally from the first side to the second side,
- wherein the tapering of the fourth shank portion from the third shank thickness to the fourth shank thickness extends from the first side to the second side; and
- wherein the end portion thickness is less than the third shank thickness.

14. An extraction electrode arm comprising:
- a first end spaced apart from a second end along a longitudinal axis;
- a first side spaced apart from a second side along a lateral axis not parallel to the longitudinal axis, the first and second sides extending longitudinally between the first and second ends;
- a first surface apart from a second surface, the first and second surfaces extending longitudinally between the first and second ends and extending laterally between the first and second sides;
- a base portion extending longitudinally from the first end toward the second end and extending laterally between the first and second sides;
- an end portion longitudinally spaced apart from the base portion and extending to the second end; and
- a diagonal shank portion extending longitudinally between the base portion and the end portion and extending laterally from a first diagonal surface region on the first side to a second diagonal surface region on the second side and having a shank thickness,
- wherein the shank thickness of the diagonal shank portion extends laterally from the first diagonal surface region to the second diagonal surface region.

15. The extraction electrode arm of claim 14 wherein the end portion includes an end portion thickness extending longitudinally to the second end and extending laterally from the first side to the second side;
wherein the shank thickness of the diagonal shank portion is greater than a thickness of the end portion.

16. The extraction electrode arm of claim 14 comprising a shank extending between the base portion and the end portion,
wherein the shank has a plurality of shank portions including:
- a first shank portion having a first shank thickness extending longitudinally from the first base portion toward the second end;
- the diagonal shank portion disposed as a second shank portion, extending longitudinally from the first shank portion toward the second end, wherein the shank thickness of the diagonal shank portion is a second shank thickness; and
- a third shank portion having a third shank thickness, extending longitudinally from the diagonal shank portion toward the second end,
wherein the third shank thickness extends laterally from the first side to the second side along a longitudinal length of the third shank portion.

17. The extraction electrode arm of claim 16 wherein the first side includes a third diagonal surface region extending along the third shank portion; and wherein the third shank thickness extends laterally from the third diagonal surface region on the first side to the second side.

18. The extraction electrode arm of claim 17 wherein the shank further includes a fourth shank portion tapering longitudinally along the second surface from the third shank thickness at the third shank portion to a fourth shank thickness;
wherein the third diagonal surface region on the first side extends along the fourth shank portion; and
wherein the tapering from the third shank thickness to a fourth shank thickness extends laterally from the third diagonal surface region to the second side.

19. The extraction electrode arm of claim 17 wherein the third diagonal surface region of the first side extends to the end portion.

20. The extraction electrode arm of claim 14 wherein the first surface comprises a recess spaced apart from the second end, extending longitudinally to the first end, and extending laterally between the first and second sides.

\* \* \* \* \*